United States Patent
Muthinti et al.

(10) Patent No.: US 11,054,250 B2
(45) Date of Patent: Jul. 6, 2021

(54) MULTI-CHANNEL OVERLAY METROLOGY

(71) Applicant: International Business Machines Corporation, Armonk, NY (US)

(72) Inventors: Gangadhara Raja Muthinti, Albany, NY (US); Chiew-Seng Koay, Albany, NY (US); Siva Kanakasabapathy, Pleasanton, CA (US); Nelson Felix, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 346 days.

(21) Appl. No.: 15/950,271

(22) Filed: Apr. 11, 2018

(65) Prior Publication Data

US 2019/0316900 A1 Oct. 17, 2019

(51) Int. Cl.
*G01B 11/27* (2006.01)

(52) U.S. Cl.
CPC ........ *G01B 11/272* (2013.01); *G01B 2210/56* (2013.01)

(58) Field of Classification Search
CPC ......... B60T 15/46; B60T 17/043; B61G 5/06; G01B 11/272; G01B 2210/56; G03F 7/70633; G01N 21/9501; G01N 21/9503; G01N 21/9505
USPC ........................................................ 356/72
See application file for complete search history.

(56) References Cited

U.S. PATENT DOCUMENTS

| | | | | |
|---|---|---|---|---|
| 5,343,290 | A * | 8/1994 | Batchelder | G01J 9/04 356/237.3 |
| 6,529,018 | B1 * | 3/2003 | Stevens | G01N 21/9501 324/754.23 |
| 7,298,496 | B2 | 11/2007 | Hill et al. | |
| 9,081,287 | B2 | 7/2015 | Mieher et al. | |
| 9,285,687 | B2 | 3/2016 | Smirnov et al. | |
| 2005/0089775 | A1* | 4/2005 | Archie et al. | 430/30 |
| 2005/0208685 | A1* | 9/2005 | Abdulhalim | H01L 23/544 438/14 |
| 2011/0085176 | A1* | 4/2011 | Cramer | G03F 1/84 356/601 |
| 2017/0082932 | A1* | 3/2017 | Fu | G03F 9/7046 |

(Continued)

OTHER PUBLICATIONS

D. Beyer et al., "Prove, the next generation registration metrology tool, status report", Proc. of SPIE, vol. 7748 77480M, pp. 1-7.

(Continued)

*Primary Examiner* — Sunghee Y Gray
(74) *Attorney, Agent, or Firm* — Cantor Colburn LLP; Randall Bluestone

(57) ABSTRACT

An overlay metrology system includes a multi-channel energy unit that selectively operates in a first mode to deliver first photons having a first wavelength to an object under test, and a second mode to deliver second photons to the object under test. The second photons have a second wavelength different from the first wavelength. The overlay metrology system further includes an electronic controller that selectively activates either the first mode or the second mode based at least in part on at least one characteristic of an object under test, and that generates the first protons or the second photons to detect at least one buried structure included in the object under test.

9 Claims, 4 Drawing Sheets

(56) References Cited

U.S. PATENT DOCUMENTS

| | | |
|---|---|---|
| 2017/0184981 A1 | 6/2017 | Quintanilha et al. |
| 2017/0205342 A1* | 7/2017 | Krishnan .................. G01J 3/36 |
| 2017/0219435 A1 | 8/2017 | Tu et al. |
| 2017/0350829 A1 | 12/2017 | Boeff et al. |
| 2017/0357155 A1 | 12/2017 | Quintanilha et al. |
| 2018/0059019 A1* | 3/2018 | Chouaib ............. G03F 7/70616 |
| 2018/0088056 A1* | 3/2018 | Shortt ................ G01N 21/9506 |
| 2018/0149603 A1* | 5/2018 | Bhattacharyya ... G01N 21/9505 |
| 2018/0299794 A1* | 10/2018 | Pandey ................. G01B 11/02 |
| 2019/0354026 A1* | 11/2019 | Witte et al. ........... G03F 9/7049 |

OTHER PUBLICATIONS

D. Popmintchev et al., "Ultraviolet surprise: Efficient soft x-ray High-harmonic generation in multiply ionized plasmas", Science Magazine, vol. 350. Issue 6265, Dec. 4, 2016, pp. 1225-1231.

Park et al., "Root cause analysis of overlay metrology excursions with scatterometry overlay technology (SCOL)", Proc. SPIE, vol. 9778, Mar. 24, 2016.

Tarshish-Shapir et al., "Overlay metrology performance prediction fidelity: the factors enabling a successful target design cycle" Metrology, Inspection, and Process Control for Microlithography XXX. vol. 9778. International Society for Optics and Photonics, Mar. 24, 2016 (14 pages).

\* cited by examiner

MULTI-CHANNEL OVERLAY METROLOGY

BACKGROUND

The present invention generally relates to the fabrication of semiconductor devices, and more specifically, to overlay metrology systems and associated methods that are configured and arranged to detect buried structures in semiconductor devices.

The fabrication of semiconductor devices can involve forming and patterning successive layers of various materials. It is common for one or more layers to include structures buried therein including, for example, contact pads, back end of line (BEOL) conductive traces, etc. In a multi-layer device, structures located at one layer can overlay the structures located at lower layers. The process flow for fabricating a multi-layer semiconductor device aims to keep the alignment offset i.e., the overlay alignment difference, between structures located at different layers at minimum acceptable tolerances.

SUMMARY

Embodiments of the present invention are directed to an overlay metrology system comprising a multi-channel energy unit configured to selectively operate in a first mode to deliver first photons having a first wavelength to an object under test, and selectively operate in a second mode to deliver second photons to the object under test. The second photons have a second wavelength different from the first wavelength. The overlay metrology system further includes an electronic controller configured to selectively activate either the first mode or the second mode based at least in part on at least one characteristic of an object under test, and to generate the first protons or the second photons to detect at least one buried structure included in the object under test.

Embodiments of the invention are directed to a method of performing an overlay analysis between first and second structures included in an object under test. The method comprises determining, via an electronic controller, that an intermediate layer is interposed between the first structure and the second structures, and activating, via the controller, a multi-channel energy unit configured to operate in a first mode and a second mode. The first mode is activated when a photon-blocking characteristic is present in the intermediate layer, and the second mode is activated when the photon-block characteristic is excluded from the intermediate layer. The method further includes delivering, via the multi-channel energy unit, first photons having a first wavelength to the object under test in response to activating the first mode to penetrate through the intermediate layer, and delivering, via the multi-channel energy unit, second photons having a second wavelength to the object under test in response to activating the second mode to penetrate through the intermediate layer. The second wavelength is different from the first wavelength. The method further includes generating an image displaying a first position of the second structure with respect to the first structure buried in the object under test and beneath the intermediate layer.

Embodiments of the invention are also directed to an overlay metrology system configured to generate an image of at least one first structure buried in an object under test. The overlay metrology system comprises a multi-channel energy unit configured to selectively operate in a first mode to generate first photons having a first wavelength, and selectively operate in a second mode to generate second photons having a second wavelength different from the first wavelength. The system further includes an electronic hardware controller configured to selectively activate either the first mode or the second mode based on a thickness of a layer included in the object under test, the layer covering the at least one first structure, wherein the multi-channel energy unit generates the first protons or the second photons to penetrate through the layer and detect the at least one first structure based on the first mode or second mode selected by the controller.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
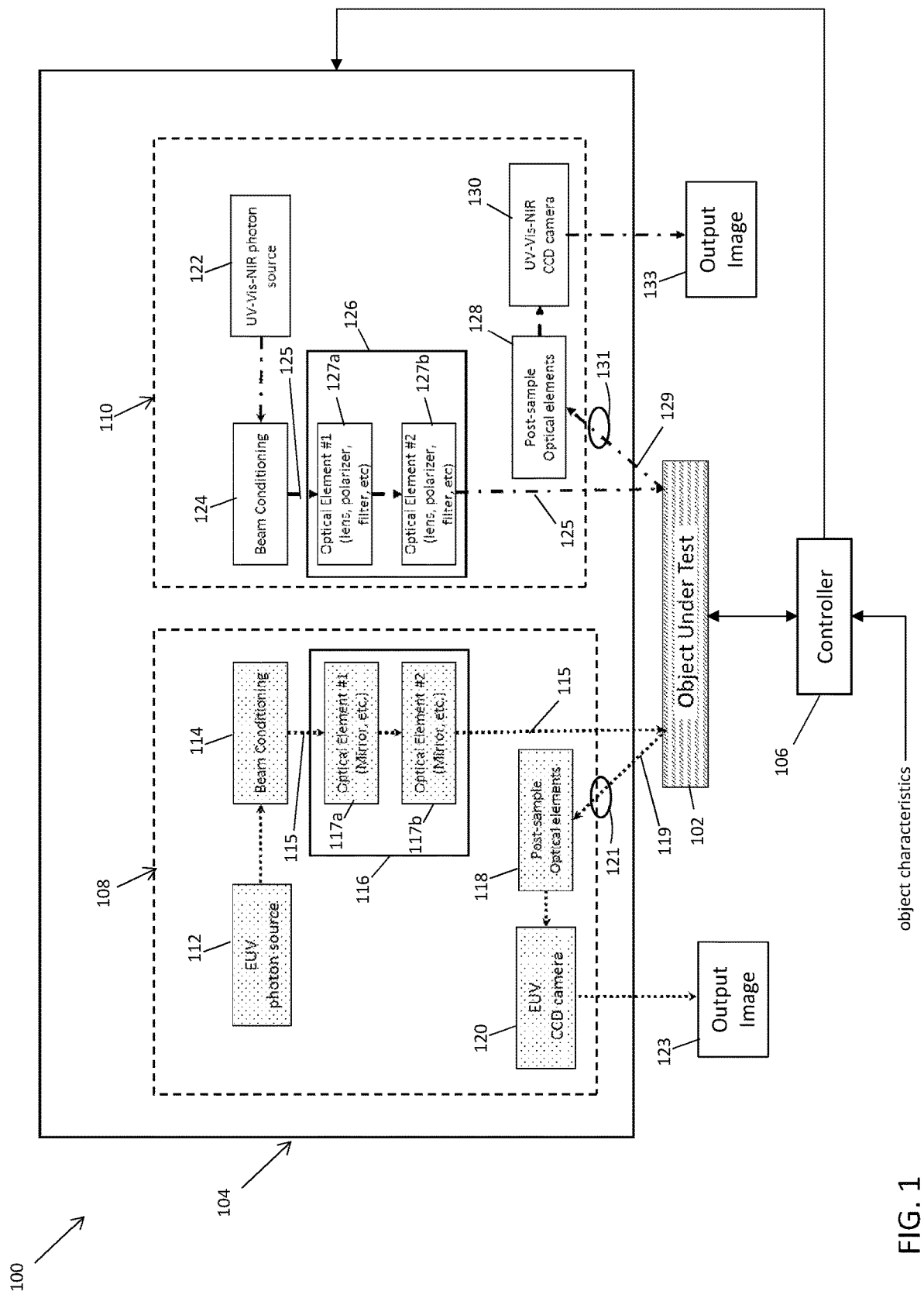
FIG. 1 depicts a multi-channel overlay metrology system according to a non-limiting embodiment of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Turning now to an overview of technologies that are more specifically relevant to aspects of the invention, a metrology tool is utilized to measure the overlay error between different semiconductor structures located at different semiconductor levels or layers. The overlay offset, also referred to as the overlay error, is typically referred to as a distance of how far a first structure (e.g., a structure formed on an upper surface of the wafer or uppermost layer) is displaced from the center of a second structure (e.g., a structured embedded in the wafer and located beneath one or more intermediate layers).

Metrology tools used to identify structures embedded in a semiconductor wafer include an optical system capable of emitting photons at Ultraviolet Visible near infrared (UV-Vis-NIR) wavelengths. The wavelength spectrum for UV-Vis-NIR energy can be defined as follows: The UV wavelength spectrum ranges from approximately 300 nanometers (nm) to approximately 400 nm; the Vis wavelength spectrum ranges from approximately 400 nm to approximately 765 nm; and the NIR wavelength spectrum ranges from approximately 765 nm to approximately 3200 nm. These UV-Vis-NIR photons can penetrate through the outer surface of the wafer or semiconductor device, along with some layers of dielectric material in order to reach structures buried within the wafer. Energy is then reflected from the structures of the device such that an image overlay analysis, scatterometry analysis, or diffraction analysis can be performed to determine the location and placement of the not only the structures formed on the surface of the device, but also the structures buried within the device. In this manner, an overlay offset (i.e. error) can be determined between a first structure located at a first layer (e.g., a patterned structured formed on the upper surface of the wafer) and a second structure located at a second layer (e.g., a buried structure located beneath the upper surface and embedded within the wafer).

The effectiveness of the UV-Vis-NIR wavelength spectrum, however, can be limited by the material composition of the intermediate layers. For instance, photons emitted at the UV-Vis-NIR wavelength spectrum are capable of penetrating through layers composed of dielectric or transparent materials. However, these UV-Vis-NIR photons are either fully absorbed by opaque materials or substantially reflected by metal material, thereby preventing the photons from reaching the structures buried beneath the layer. In addition, the ability of the UV-Vis-NIR wavelength to detect buried structures can also be limited by the thickness of the intermediate layer covering the buried structures. For example, UV-Vis-NIR photons are ineffective at penetrating metal films having a thickness greater than approximately 50 nanometers.

Energy at the Extreme Ultraviolet (EUV) wavelength spectrum ranges from approximately 10 nm to approximately 125 nm. Photons emitted at the EUV wavelength have been found to be capable of penetrating through layers composed of opaque and/or metal materials. These EUV photons, however, are more susceptible to absorption by dielectric materials compared to UV-Vis-NIR photons. Therefore, although EUV photons can detect structures buried beneath layers composed of opaque and/or metal materials, they can reduce accuracy when detecting structures buried beneath layers composed of dielectric materials. Dielectric materials commonly used in semiconductor fabrication include, for example, oxide materials, nitride materials, and ultra low-k (ULK) materials, which are commonly implemented in semiconductor fabrication processes and various semiconductor devices.

Turning now to an overview of the aspects of the invention, one or more embodiments of the invention address the above-described shortcomings of the prior art by providing a multi-channel overlay metrology system configured to selectively operate in a UV-Vis-NIR mode and an EUV mode to perform an overlay metrology analysis on an object under test. When the object under test (e.g., semiconductor wafer) includes a dielectric layer covering one or more targeted buried structures, the UV-Vis-NIR mode is selected and a first energy channel delivers UV-Vis-NIR photons to the object under test. When, however, the object under test (e.g., semiconductor wafer) includes a metal or opaque layer covering one or more targeted buried structures, the EUV mode is selected and a second energy channel delivers EUV photons to the object under test. In this manner, an overlay error analysis between buried structures and surface structures can be performed regardless as to the composition of the intermediate layers included in the object under test.

With reference now to FIG. 1, an overlay metrology system 100 configured to perform an overlay error analysis on an object under test 102 is illustrated according to a non-limiting embodiment of the invention. As described herein, the object under test 102 can include a wafer or semiconductor device, for example, including one or more intermediate layers (not shown in FIG. 1). The wafer 102 can be composed of a semiconductor material such as, for example, silicon (Si). The intermediate layers can be composed of various materials including, but not limited to, dielectric materials, semiconductor materials, metal materials, transparent materials, opaque materials, and reflective materials.

The overlay metrology system 100 includes a multi-channel energy unit 104 in signal communication with an electronic hardware controller 106. The multi-channel energy unit 104 includes a first energy system 108 configured to generate energy at a first wavelength spectrum (e.g., photons having a first wavelength) and second energy system 110 to generate energy at a second wavelength spectrum (e.g., photons having a second wavelength). In one or more embodiments of the invention, the first energy system 108 is constructed as a EUV energy system 108 that generates photons having a wavelength defined by the EUV wavelength spectrum ranging from approximately 10 nm to approximately 125 nm. The second energy system 110 can be constructed as UV-Vis-NIR energy system 110 that generates photons having a wavelength defined by the UV-Vis-NIR wavelength spectrum. The UV wavelength spectrum ranges from approximately 300 nanometers (nm) to approximately 400 nm; the Vis wavelength spectrum ranges from approximately 400 nm to approximately 765 nm; and the NIR wavelength spectrum ranges from approximately 765 nm to approximately 3200 nm. Although going forward the first and second energy systems will be referred to as the EUV energy system 108 and the UV-Vis-NIR energy system 110, respectively, it should be appreciated that the first energy system 108 is not limited to the EUV wavelength spectrum and the second energy system 110 is not limited to the UV-Vis-NIR wavelength spectrum described herein.

The multi-channel energy unit 104 can selectively operate in either a first mode (e.g., to activate the EUV energy system 108) or a second mode (e.g., to activate the UV-Vis-NIR energy system 110). The controller 106 can select the operating mode of the multi-channel energy unit 104 based on the characteristics of the object under test 102. Accordingly, an overlay error analysis between buried structures (not shown in FIG. 1) and surface structures (not shown in FIG. 1) can be performed regardless as to the composition of the intermediate layers included in the object under test 102 (e.g., the semiconductor wafer).

The EUV energy system 108 includes a first energy source 112, a first beam conditioning subsystem 114, a first optical subsystem 116, a first post-optical subsystem 118, and a first imaging unit 120. The first energy source 112 is configured to generate EUV photons having a EUV wavelength (e.g., ranging from about 10 nm to about 125 nm). Various photon source power supplies provided by Cymer®, for example, can be employed.

The first beam conditioning subsystem 114 includes, for example, an optical resonator that boosts the photons from the first energy source 112 into a higher-energy EUV beam 115. Beam conditioning is performed through careful alignment and allowing light to travel through series of optical elements like polarizers, compensators and mirrors. Characteristics of optical elements are optimized based on the incoming wavelength and laser source. Polarizers are used to induce directionality to source radiation, while compensators are utilized to alter phase as needed for overlay measurement. Mirrors and lenses are additional components used to focus the light beam precisely on to the target structure on the sample and direct the diffracted signal to detector.

The first optical system 116 includes one or more optical elements 117a and 117b. The optical elements 117a and 117b can include mirrors, for example, which further focus the EUV beam 115 before the delivering it, via a first energy channel, to the object under test 102. Mirrors are also configured to increase the cumulative intensity of incoming radiation. In this manner, the focused EUV beam 115 can be scanned across the object under test 102 and/or focused on one or more targeted areas of the object under test 102.

The first post-optical subsystem 118 receives reflected energy 119 (e.g., reflected photons) detected by one or more first sensors 121, and performs one or more signal analysis operations on the reflected energy 119. >In one more embodiments of the invention, diffracted or reflected optical signal passes through series of compensators (not shown), an analyzer unit or analyzer controller (not shown), and finally reach a solid state detector (not shown). The analyzer is used to identify and extract necessary characteristics (phase, polarization, intensity) of the diffracted signal. Solid state detectors are fast, efficient and convert the light signal to digital signal for further data analysis.

The first imaging unit 120 is in signal communication with the first post-optical subsystem 118. The first imaging unit 120 can be constructed as a charge-coupled device (CCD) camera, for example, which can generate an image 123 of the object under test 102 based on the sampled signal output from the first post-optical subsystem 118. The image 123 not only shows the exterior profile and surface structures of the object under test 102, but also shows the profile of buried structures embedded in the object under test 102. In this manner, an overlay error analysis of the surface structures and buried structures can be performed as described in greater detail below.

The UV-Vis-NIR energy system 110 includes a second energy source 122, a second beam conditioning subsystem 124, a second optical subsystem 126, a second post-optical subsystem 128, and a second imaging unit 130. The second energy source 122 is configured to generate UV-Vis-NIR photons having a UV-Vis-NIR wavelength. As described herein, the UV wavelength spectrum ranges from approximately 300 nanometers (nm) to approximately 400 nm; the Vis wavelength spectrum ranges from approximately 400 nm to approximately 765 nm; and the NIR wavelength spectrum ranges from approximately 765 nm to approximately 3200 nm. Therefore, the full UV-Vis-NIR wavelength spectrum can range from about 300 nm to about 3200 nm.

The second beam conditioning subsystem 124 includes, for example, an optical resonator that boosts the photons from the second energy source 122 into a higher-energy UV-Vis-NIR photon beam 125

The second optical system 126 includes one or more optical elements 127a and 127b. The optical elements 127a and 127b can include mirrors, lenses, polarizers, and energy filters, for example, which further focus the UV-Vis-NIR beam 125. The UV-Vis-NIR beam 125 is then delivered, via a second energy channel, to the object under test 102. Although not illustrated, mirrors can also be included in the optical elements 127. Accordingly, the second optical system 126 generates a UV-Vis-NIR beam 125, which can be scanned across the object under test 102 and/or focused on one or more targeted areas of the object under test 102.

The second post-optical subsystem 128 receives reflected energy 129 (e.g., reflected photons) detected by one or more second sensors 131, and performs one or more signal analysis operations on the reflected energy 129.

The second imaging unit 130 is in signal communication with the second post-optical subsystem 128. The second imaging unit 130 can be constructed as a charge-coupled device (CCD) camera, for example, which can generate an image 133 of the object under test 102 based on the sampled signal output from the second post-optical subsystem 128. As described above, the image 133 not only shows the exterior profile and surface structures of the object under test 102, but also shows the profile of buried structures embedded in the object under test 102 so that an overlay analysis of the surface structures and buried structures can be performed.

As described herein, the controller 106 can automatically switch the operating mode of the multi-channel energy unit 104 based on the characteristics of the object under test 102. In one or more embodiments of the invention, the controller 106 receives data characteristics associated with the object under test 102. In one or more embodiments of the invention, the characteristics are associated with the structural characteristics of a semiconductor device, for example. The characteristics include, but are not limited to, whether the object under test 102 includes one or more intermediate layers, the material composition of the layers, and the thickness of the layers. The data can also indicate whether the material composition of the intermediate layers includes a non-photon blocking characteristic or a photon blocking characteristic. The non-photon blocking characteristics include, for example, a transparent layer, a layer composed of a dielectric material, and/or a layer that is less than or equal to a thickness threshold. The photon blocking characteristics include, for example, an opaque layer, a reflective layer, a layer composed of a metal material, and/or a layer that exceeds a thickness threshold.

Figure 2:
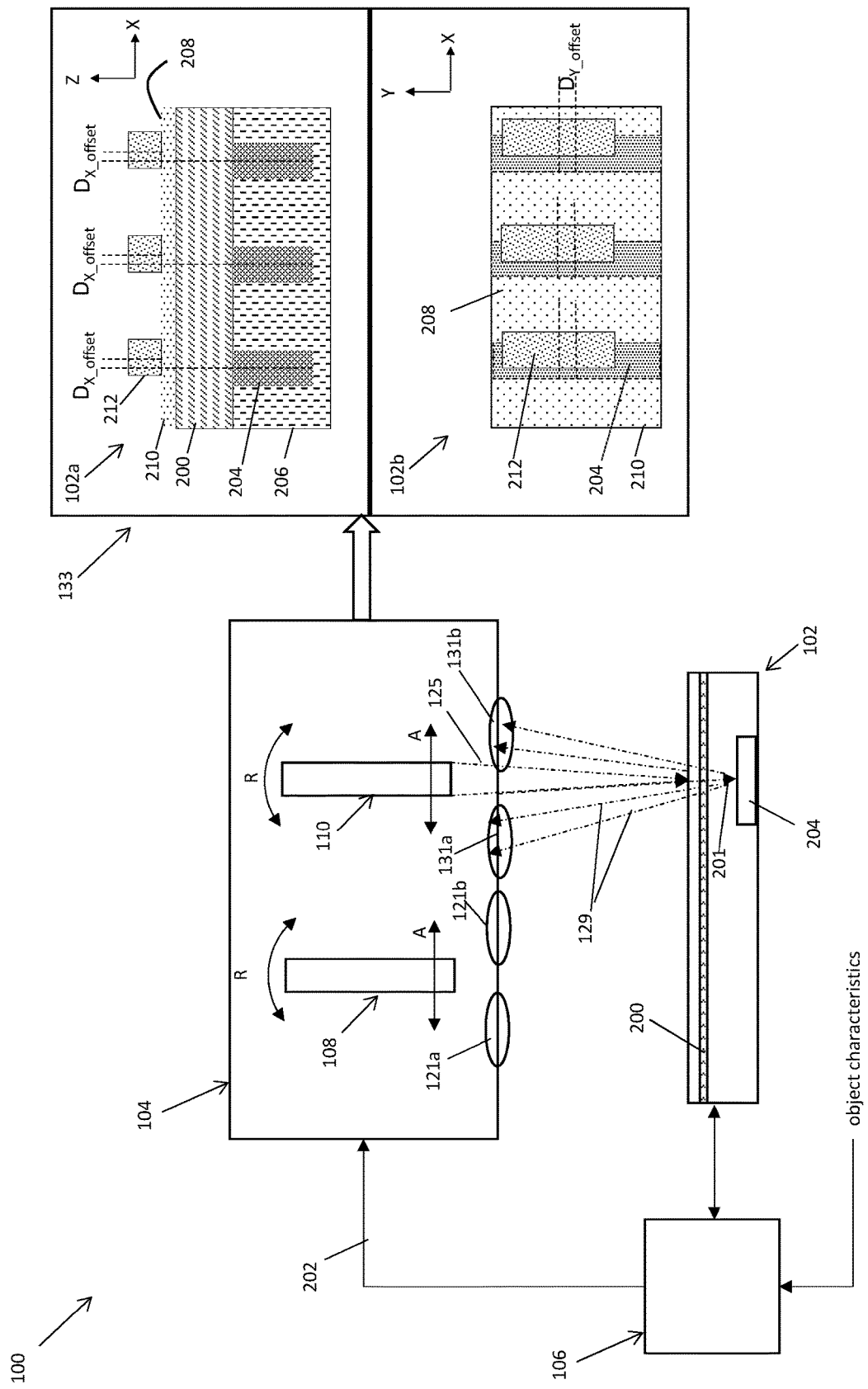
FIG. 2 depicts the multi-channel overlay metrology system operating in a first mode according to a non-limiting embodiment of the invention.

Referring to FIG. 2, the controller 106 receives data indicating that the object under test 102 includes an intermediate layer 200 having non-photon blocking characteristics. Accordingly, the controller 106 outputs a control signal 202, which activates the UV-Vis-NIR energy system 110 to generate a photon beam 125 having a wavelength defined by the UV-Vis-NIR wavelength spectrum. In one or more embodiments of the invention, the UV-Vis-NIR energy system 110 can move along an axis (A) and/or can rotate about a pivot (R) so as to scan one or more surfaces of the object under test 102.

The photon beam 125 impinges upon the surface of the object under test 102 and travels therethrough to reach the intermediate layer 200. Because the intermediate layer 200 has non-photon blocking characteristics, a substantial portion (e.g., the majority) of the photon beam 125 penetrates through the layer 200 and reaches one or more buried structures 204. Reflected portions 129 of the initial photon beam 125 along with reflected portions of the penetrating photon beam 201 are detected by sensors 131a and 131b, and are processed by the post-optical subsystem 128 (not shown in FIG. 2). Based on the photon beam reflections 129, one or more images 133 of the object under test 102 are generated. The images include, for example, an internal side-view 102a (extending along the X and Z axes) of the object under test 102, and a top view 102b (extending along the Y and Z axes) of the object under test 102.

The internal side-view 102a shows the object under test 102 as a semiconductor device 102 including an intermediate layer 200 interposed between a bulk layer 206 and an upper surface 208 of the semiconductor device 102. In one or more embodiments of the invention, the upper surface 208 can include an underlying surface layer 210. The upper surface 208 includes one or more surface structures 212. The surface structures 212 include, but are not limited to, contact pads, vias, back end of the line (BEOL) contact traces, patterned masking elements, patterned hardmask elements, etc. One or more buried structures 214 are embedded in the bulk layer 206 and located beneath the intermediate layer 200 a. The buried structures 204, include, but are not limited to, contact pads, vias, back end of the line (BEOL) contact traces, etc.

The images 102a and 102b make it possible for a user or technician to visually identify an overlay offset between the surface structures 212 and the buried structures 204. For instance, the buried structures 204 can be utilized as a reference position. In this manner, the overlay offset (Dx_offset), also referred to as an error, can be determined by determining a difference between the center of a given buried structure 204 and the center of a surface structure 212 located directly above the given buried structure 204.

The controller 106 can calculate the precise overlay offset (i.e., error) of the surface structures 212 with respect to the buried structures 204. For example, the controller 106 can implement various scatterometry-based overlay metrology algorithms. In another example, the controller 106 can perform diffraction-based overlay techniques to calculate the overlay offset. The controller 106 can also perform Mueller-matrix-based overlay techniques to calculate the overlay offset.

Figure 3:
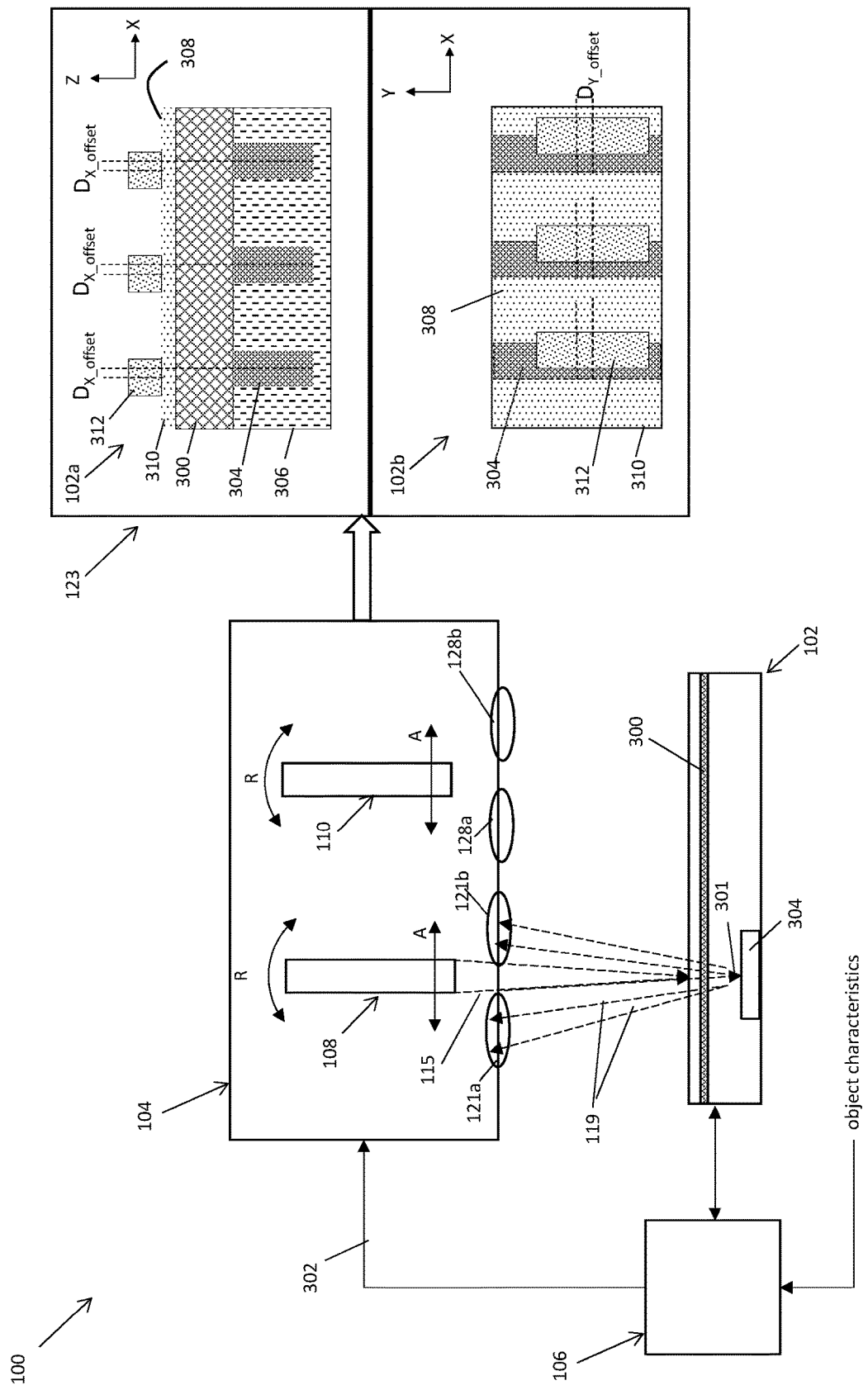
FIG. 3 depicts the multi-channel overlay metrology system operating in a second mode according to a non-limiting embodiment of the invention.

Turning to FIG. 3, however, the object under test 102 includes an intermediate layer 300 having one or more characteristics that block, or significantly inhibit, UV-Vis-NIR photons from passing therethrough. In response to determining that the intermediate layer 300 has one or more photon-blocking characteristics, the controller 106 automatically activates the EUV energy system 108 to generate a photon beam 115 having a wavelength defined by the EUV wavelength spectrum. In one or more embodiments of the invention, the EUV system 108 can move along an axis (A) and/or can rotate about a pivot (R) so as to scan one or more surfaces of the object under test 102.

The photon beam 115 impinges upon the surface of the object under test 102 and travels therethrough to reach the intermediate layer 300. Because the EUV photon beam 215 can penetrate through the intermediate layer 300, a substantial portion (e.g., the majority) of the photon beam 115 reaches one or more buried structures 304. Reflected portions 139 of the initial photon beam 115 along with reflected portions 119 of the penetrating photon beam 301 are detected by sensors 212a and 121b, and are processed by the post-optical subsystem 118 (not shown in FIG. 3). Based on the photon beam reflections 119, one or more images 123 of the object under test 102 are generated. The images include, for example an internal side-view 102a (extending along the X and Z axes) of the object under test 102, and a top view 102b (extending along the Y and Z axes) of the object under test 102.

The internal side-view 102a shows the object under test 102 as a semiconductor device 102 including an intermediate layer 300 interposed between a bulk layer 306 and an upper surface 308 of the semiconductor device 102. In some embodiments of the invention, the upper surface 308 can include an underlying surface layer 310. The upper surface 308 includes one or more surface structures 312. The surface structures 312 include, but are not limited to, contact pads, vias, back end of the line (BEOL) contact traces, patterned masking elements, patterned hardmask elements, etc. One or more buried structures 304 are embedded in the bulk layer 306 and are located beneath the intermediate layer 300. The buried structures 304, include, but are not limited to, contact pads, vias, BEOL contact traces, etc.

As described above, the images 102a and 102b make it possible for a user or technician to visually identify an overlay offset between the surface structures 312 and the buried structures 304. The controller 106 can also calculate the precise overlay offset of the surface structures 312 with respect to the buried structures 304 using various scatterometry-based overlay metrology algorithms, diffraction-based overlay techniques, and/or Mueller-matrix-based overlay techniques.

Figure 4:
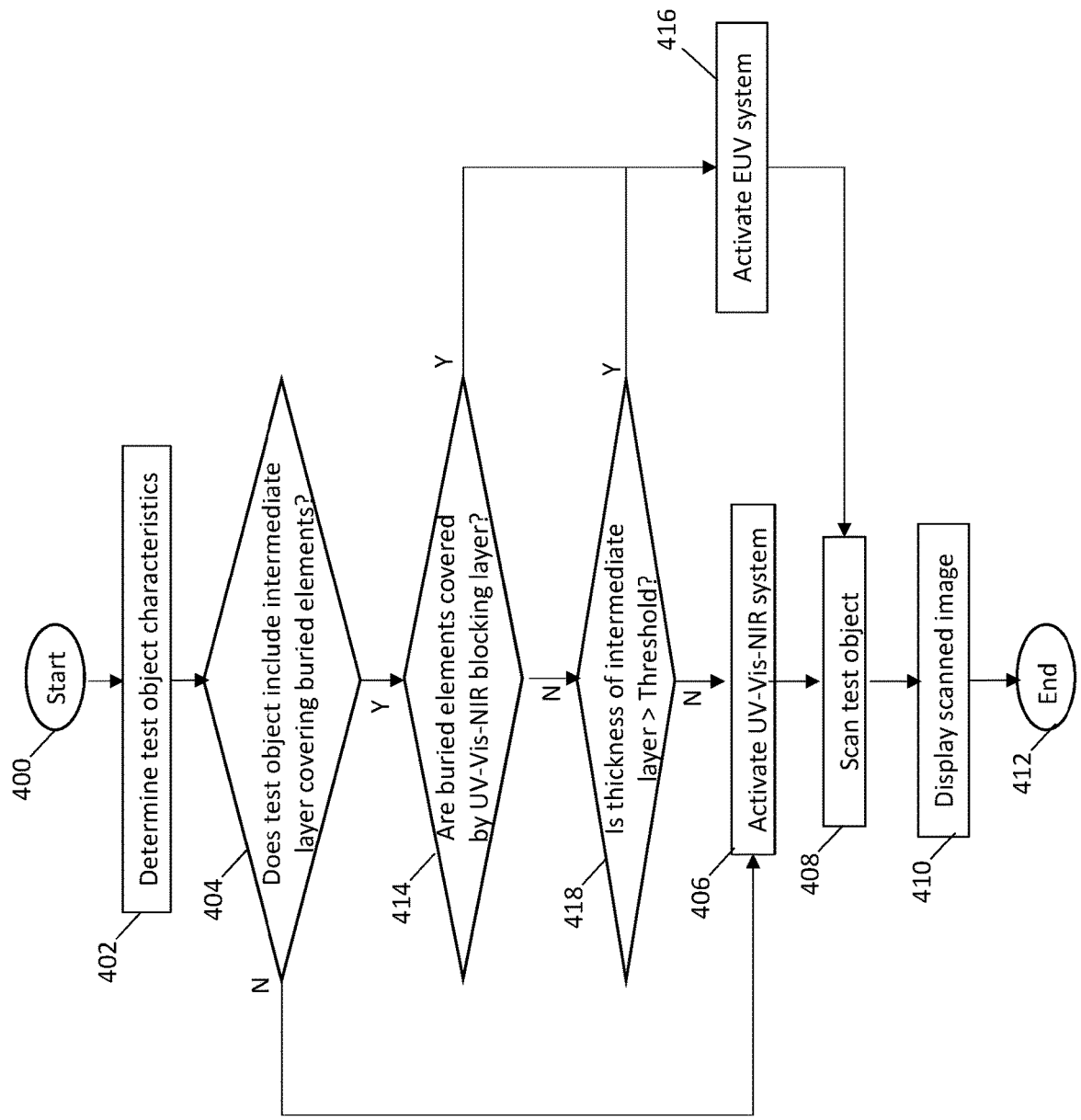
FIG. 4 depicts a flow diagram illustrating a method of performing an overlay analysis of an object under test according to a non-limiting embodiment of the invention.

With reference to FIG. 4, a method of performing an overlay analysis of an object under test is illustrated according to a non-limiting embodiment of the invention. The method begins at operation 400, and at operation 402 the characteristics of the object under test are determined. The characteristics can be associated with the structural characteristics of a semiconductor device, for example. In one or more embodiments of the invention, data indicating the characteristics of the object under test are input to a controller. At operation 404, the characteristics are analyzed and a determination is made, via the controller, as to whether the object under test includes one or more intermediate layers, e.g., layers embedded the object. In the case of semiconductor device, the device can include one or more intermediate layers coated between the base of the device an upper surface of the device.

When the object under test excludes intermediate layers, the method proceeds to operation 406, and the controller 106 automatically activates the UV-Vis-NIR energy system. At operation 408, the UV-Vis-NIR energy system generates UV-Vis-NIR photons, which are delivered to the object under test. An image of the object under test is generated at operation 410, and the method ends at operation 412.

When, however, the object under test includes an intermediate layer, the method proceeds to operation 414 and determines whether one or more targeted buried structures in the object under test are covered by the intermediate layer. When the targeted buried structures are covered by the intermediate layer, the method automatically activates the controller at operation 416, and the UV-Vis-NIR energy system generates UV-Vis-NIR photons that are delivered to the object under test at operation 408. At operation 410 an image of the object under test is generated, and the method ends at operation 412.

When, however, the targeted buried structures are not covered by an intermediate layer at operation 414, the method proceeds to operation 418 and determines whether a thickness of the intermediate layer covering the targeted buried structures exceeds a thickness threshold. When the thickness of the intermediate layer exceeds the thickness threshold, the method automatically activates the controller at operation 416, and the UV-Vis-NIR energy system generates UV-Vis-NIR photons that are delivered to the object under test at operation 408. At operation 410, an image of the object under test is generated, and the method ends at operation 412.

When, however, the thickness of the intermediate layer is less than or equal to the thickness threshold, the controller automatically activates the UV-Vis-NIR energy system. At operation 408, the UV-Vis-NIR energy system generates UV-Vis-NIR photons, which are delivered to the object under test. An image of the object under test is generated at operation 410, and the method ends at operation 412.

Accordingly, various non-limiting embodiments of the invention described herein provide a multi-channel overlay metrology system configured to selectively operate in a UV-Vis-NIR mode and a EUV mode to perform an overlay metrology analysis on an object under test. When the object under test (e.g., semiconductor wafer) includes a layer composed of a non-photon blocking characteristic (e.g., transparent layer or layer composed of dielectric material), the UV-Vis-NIR mode is selected and a first energy channel delivers UV-Vis-NIR photons to the object under test. When, however, the buried structures are covered by a layer composed of a photon-blocking characteristic (e.g., an opaque material, a reflective material, a thick layer, etc.), the EUV mode is selected and a second energy channel delivers EUV photons to the object under test. In this manner, an overlay error analysis between buried structures and surface structures can be performed regardless as to the composition of the intermediate layers included in the semiconductor wafer.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" include any integer number greater than or equal to one, i.e. one, two, three, four, etc. The terms "a plurality" include any integer number greater than or equal to two, i.e. two, three, four, five, etc. The term "connection" includes both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. An overlay metrology system comprising:
a multi-channel energy unit configured to:
selectively operate in a first mode to deliver first photons having a first wavelength to an object under test; and
selectively operate in a second mode to deliver second photons to the object under test, the second photons having a second wavelength different from the first wavelength; and
an electronic controller configured to:
selectively activate either the first mode or the second mode based at least in part on at least one characteristic of an object under test to generate the first photons or the second photons to detect at least one buried structure included in the object under test,
wherein the at least one characteristic includes the presence of at least one intermediate layer between the at least one buried structure and at least one second component.

2. The overlay metrology system of claim 1, wherein the first wavelength is included in an Extreme Ultraviolet (EUV) wavelength spectrum, and the second wavelength is included in an Ultraviolet Visible near infrared (UV-Vis-NIR) wavelength spectrum.

3. The overlay metrology system of claim 2, wherein the (EUV) wavelength spectrum ranges from approximately 10 nanometers (nm) to approximately 125 nm, and the UV-Vis-NIR wavelength spectrum ranges from approximately 300 nm to approximately 3200 nm.

4. The overlay metrology system of claim 3, wherein the electronic controller is configured to:
detect the characteristics of the object under test; and
activate the first mode or the second mode based at least in part on the detected characteristics.

5. The overlay metrology system of claim 4, wherein the at least one second component includes a surface structure formed on an upper surface of the object under test.

6. The overlay metrology system of claim 5, wherein the at least one characteristic further include a material composition of the at least one intermediate layer.

7. The overlay metrology system of claim 6, wherein the at least one characteristic further include a material composition of the at least one intermediate layer.

8. The overlay metrology system of claim 7, wherein the electronic controller selects the first mode when the at least one intermediate layer is either opaque or reflective, and selects the second mode when the intermediate layer is transparent.

9. The overlay metrology system of claim 8, wherein the electronic controller selects the first mode when the material composition is at least one of a metal material and a semiconductor material, and selects the second mode when the material composition is a dielectric material.

* * * * *